(12) United States Patent
Razeghi

(10) Patent No.: US 6,577,659 B1
(45) Date of Patent: Jun. 10, 2003

(54) SEMICONDUCTOR LASER DIODE

(75) Inventor: Manijeh Razeghi, Wilmette, IL (US)

(73) Assignee: MP Technologies, L.L.C., Wilmette, IL (US)

( * ) Notice: Subject to any disclaimer, the term of this patent is extended or adjusted under 35 U.S.C. 154(b) by 238 days.

(21) Appl. No.: 09/617,864

(22) Filed: Jul. 17, 2000

(51) Int. Cl.$^7$ .............................. H01L 33/00; H01S 3/19
(52) U.S. Cl. ......................... 372/45; 372/46; 257/103; 257/94; 257/96
(58) Field of Search ........................ 372/43, 45, 46; 257/22, 103, 94, 96, 97

(56) References Cited

U.S. PATENT DOCUMENTS

| | | | |
|---|---|---|---|
| 5,650,635 A | 7/1997 | Razeghi | 257/22 |
| 5,658,825 A | 8/1997 | Razeghi | 438/37 |
| 5,807,765 A | 9/1998 | Razeghi | 438/38 |
| 5,995,529 A | * 11/1999 | Kurtz et al. | 372/45 |
| 6,319,565 B1 | * 11/2001 | Todd et al. | 427/531 |

OTHER PUBLICATIONS

J. Diaz, et. al.; InAsSbP/InAsSb/InAs laser diodes grown by low–pressure metal–organic chemical–vapor deposition App. Phys. Lett. Jan. 1997, vol. 70, No. 1, pp. 40–42.

A.A. Allerman, et al.; InAsSb–based mid–infrared lasers and light–emitting diodes with AlAsSb claddings and semimetal electron injection, grown by metaloganic chemical capor deposition, Appl. Phys. Lett., Jul. 1996, vol. 69, No. 4, pp. 465–467.

S.J. Eglash, et al., InAsSb/AlAsSb double–heterostructure diode lasers emitting at 4 um, Appl. Phys. Lett, Feb. 1994, vol. 64, No. 7, pp. 833–835. (Abstract only).

* cited by examiner

*Primary Examiner*—Minh Loan Tran
(74) *Attorney, Agent, or Firm*—Welsh & Katz, Ltd.

(57) ABSTRACT

The subject invention comprises a high power MWIR laser grown as a Double Heterostructure by MOCVD<MBE or a combination of the two growth techniques. The Double Heterostructure is prepared as InAsSb/InAsSbP/AlAsSb/InAs. This structure is etched to form mesas and contacts are applied. The MWIR laser of the subject invention may be used in various optoelectric and electronic devices such as detectors, transistors, and waveguide.

5 Claims, 3 Drawing Sheets

Photoresist layer
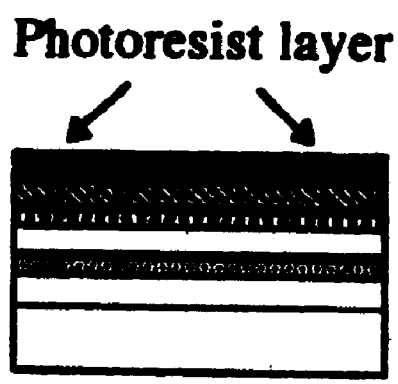
Fig. 1(a)
UV - light
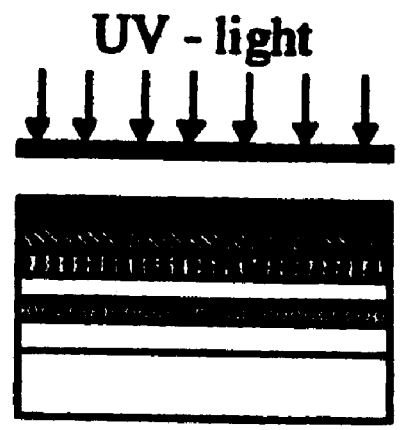
Fig. 1(b)
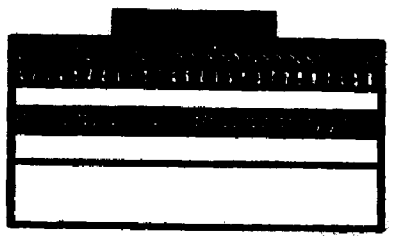
Fig. 1(c)
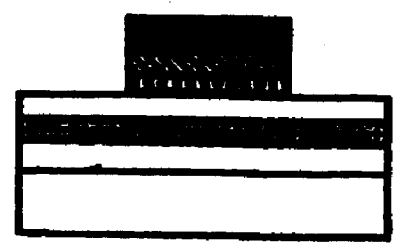
Fig. 1(d)
 photoresist layer  InAs layer
 metal layer  active layer exclusive  # SEMICONDUCTOR LASER DIODE This invention is made with government support under Grant DAAH04-951-0343 awarded by the ARPA/United States Army. The government has certain rights in the invention.

This application relates to semiconductor III–V alloy DH and SCH structures and to a method of preparing such structures for use in mid-infrared lasers.

BACKGROUND OF THE INVENTION

The growth of semiconductor III–V compounds by chemical vapor deposition (CVD) using organometallics and hydrides as elemental sources for use in lasers has recently developed into a viable process. Further, the development of high power midwavelength infrared (MWIR) laser has been an active area of research for applications in military counter systems, high-resolution molecular spectroscopy, remote sensing of chemical and biological agents, and optical fiber communication. High power operation is of great importance to most of these applications as it enhances sensitivity and the spatial range of operation. At present, several semiconductor material systems grown by either liquid phase epitaxy or molecular beam epitaxy are being investigated to produce MWIR lasers. The metalloorganic chemical vapor deposition (MOCVD) process, based on the pyrolysis of alkyls of group-III elements in an atmosphere of the hydrides of group-V elements, is also a common growth technique because it is well adapted to the growth of submicron layers and heterostructures.

Open-tube flow systems may be used at atmospheric or reduced pressures in the MOCVD technique in producing the III–V alloys. The process requires only one high-temperature zone for the in situ formation and growth of the semiconductor compound directly on a heated substrate. Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow. In AsSbP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD and MOMBE.

The molecular beam epitaxy (MBE) process involves the reaction of one or more thermal beams of atoms and molecules of the III–VB elements with a crystalline substrate surface held at a suitable temperature under ultra-high-vacuum (UHV) conditions. Since MBE is essentially a UHV evaporation techniques, the growth process can be controlled in situ by the use of equipment such as a pressure gauge, mass spectrometer and electron diffraction facility located inside the MBE reactor. The MBE growth chamber can contain other components for surface analytical techniques, including reflection high-energy electron diffraction (RHEED), X-ray photoelectron spectroscopy (XPS), low-energy election diffraction (LEED), electron spectroscopy for chemical analysis (ESCA), secondary-ion mass spectroscopy (SIMS) and ellipsometry, which can all be used as in situ surface diagnostic techniques during MBE growth, due to the UHV growth conditions.

MBE is an excellent crystal growth technology, especially for GaAs-based multilayer structures, because of its extremely precise control over layer thickness and doping profile, and the high uniformity of the epitaxial layer over a large area of a substrate (>3 inch diameter).

SUMMARY OF THE INVENTION

An object, therefore, of the invention is the preparation of a MWIR laser.

A further object of the subject invention is an III–V semiconductor providing a high power operation in a laser.

These and other objects are attained by the subject invention wherein a MWIR laser detector, transistor, or waveguide is made possible by the growth of a Double Heterostructure by MOCVD, MBE or a combination of the two growth techniques. A first Double Heterostructure is prepared as InAsSb/InAsSbP/InAs, and then the p-cladding layer is substituted with $AlAs_{0.01}Sb_{0.84}$.

Epilayers in III–V semiconductor lasers of the subject invention may be etched for mesa formation by first etching in a strong acid solution, such as a 10% hydrofluoric solution. Mesas are formed with standard photolithography procedures. A second step of immersion in a second solution of $H_2SO_4, H_2O_2, H_2O(1:1:20)$ is then conducted for 2–7 seconds at room temperature. The result is a smoother and more uniform temperature to etch approximately 0.1 $\mu$m of the cap layer. The substrate is mechanically lapped and polished and contacts are formed.

DESCRIPTION OF THE DRAWINGS

These and other objects are attained, together with additional features contributing thereto and advantages accruing therefrom will be apparent from the following detailed description of various embodiments of the invention when used in conjunction with the accompanying drawings, wherein:

FIGS. 1a–1d are schematic representations of the steps involved in preparing a InAsSb/InAsSbP/InAs structure according to the subject invention.

DETAILED DESCRIPTION OF THE INVENTION

Figures 2A, 2B:
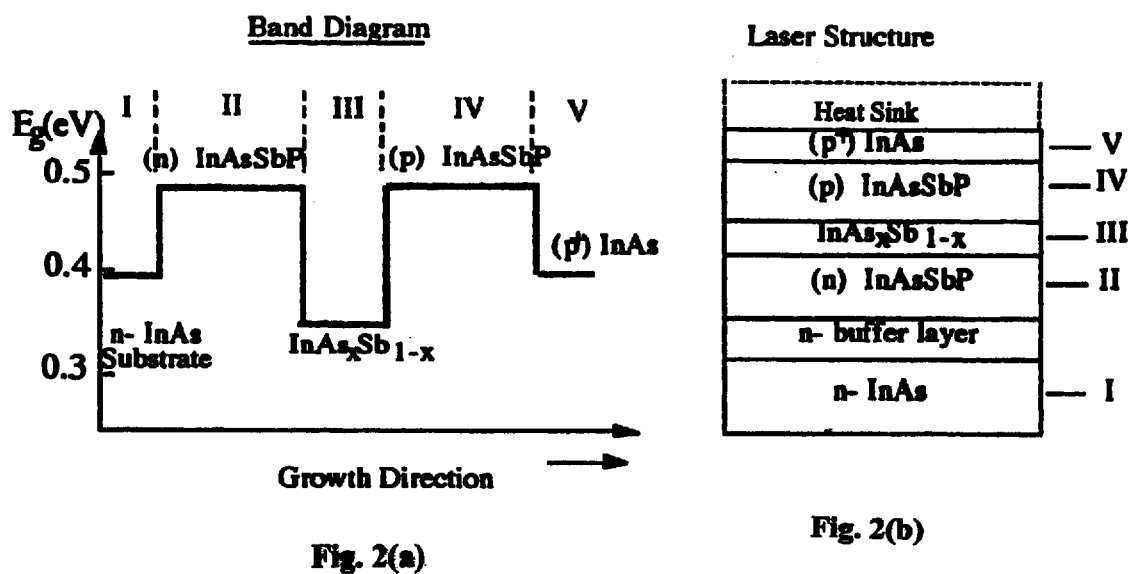
FIGS. 2(a) and (b) is a band diagram and structure of the double heterostructure InAsSbP/InAsSb/InAs with InAs as the cap layer.

The reactor and associated gas-distribution scheme used herein are substantially as described in U.S. Pat. No. 5,384,151 for MOCVD. The system comprises a cooled quartz reaction tube pumped by a high-capacity roughing pump (120 $hr^{-1}$) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters min-1, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The substrate can be GaAs, Si, $Al_2O_3$, MgO, SiC, ZnO, $LiGaO_2$, $LiAlO_2$, CdTe, SiC, InAs, InP, Ga, Sb, InSb, $MgAl_2O_4$ or GaN. Preferably, InAs is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

The layers of the heterostructure are grown by an induction-heated horizontal cool wall reactor. Trimethylindium (TMI), Triethylgallium (TEG) and Trimethyl Arsenic (TMAs) are typically used as the sources of Indium, Gallium, and Arsenic, respectively. Trimethyl Aluminum (TMAl) and Trimethyl Antimony (TMSb) are used as sources of Aluminum and Antimony, respectively. Sample is typically grown on a sapphire substrate. A barrier layer of AlInSb, GaInSb, or InAs is individually laid on the substrate at thicknesses from 50 Å to a few µm. The doped active layer is InAsSb. The example of optimum growth conditions for the respective layers are listed in Table 1. The confinement of the active layer for the subject invention should be as a heterostructure.

Doping is preferably conducted with bis-cyclopentadienyl magnesium ($Cp_2Mg$) for p-type doping and silane ($SiH_4$) for n-type doping. Doping is performed through a $BCp_2$ Mg bubbler with $H_2$ as carrier gas and at temperatures from −15° C. to ambient temperatures at 20–1500 $cm^3$ $min.^{−1}$ and onto either a hot or cooled substrate. Dilute $SiH_4$ may be simply directed at ambient temperatures onto the hot, substrate at 20–90 $cm^3$ $min.^1$. Dopants usable in the method of the subject invention are as follows:

| n dopant | p dopant |
|---|---|
| $H_2Se$ | $(CH_3)_2Zn$ |
| $H_2S$ | $(C_2H_5)_2Zn$ |

| n dopant | p dopant |
|---|---|
| $(CH_3)_3Sn$ | $(C_2H_5)_2Be$ |
| $(C_2H_5)_3Sn$ | $(CH_3)_2Cd$ |
| $SiH_4$ | $(\eta C_2H_5)_2Mg$ |
| $Si_2H_6$ | $Cp_2Mg$ |
| $GeH_4$ | |

Codoping with two or more like type dopants may also be utilized.

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2–3 minutes, the dopant flow is terminated and the next epilayer grown. By this method, it is found that 1020 atoms/cm3 of Mg may be placed on the top surface of the epilayer.

A III–V semiconductor structure based on an Sb-based composition is prepared, as known in the art. Examples would be a double heterostructure of InAsSbP/InAsSb/InAs or InAsSbP/$AlAs_xSb_{1−x}$/$InAs_xSb_{1−x}$ ($0 \leq x \leq 1$). The quaternary confinement layer of InAsSbP may be passivated with $Al_2O_3$ beginning with an organic cleaning (trichloroethane, acetone and methanol) followed by a 10% hydrofluoric dip for several seconds. The formation of a 100 µm mesa is accomplished by using photolithography technology on the InAs cap layer. For the current to be confined along a 100 µm stripe contact, a wet chemical etch of $H_2SO_4$:$H_2O_2$:$H_2O$ (1:1:20) is used for one minute to etch approximately 0.3–0.4 µm of p+-InAs. A schematic cross-section of a processing sequence for a 100 µm broad-area laser is shown in FIGS. 1(a–d).

A 200 µm TiPt/Au (450 Å/500 Å/1800 Å) metal contact pad is formed over the 100 µm mesa structure to provide electrical contact, followed by annealing. The composition of the n-InAs contact is composed of AuGe (700 Å)-Ni (350 Å)-Au (1800 Å) which provides low contact resistance to the p-contact.

EXAMPLES

1. Double heterostructures (DH) $InAs_xSb_{1−x}$/InAsSbP/InAs ($0 \leq x \leq 1$) were grown on (100) oriented Te-doped InAs substrates of FIG. 2(a) by MOCVD under standard growth conditions. The DH lasers have an undoped 1.0 µm-thick active layer InAsSb (Region III of FIG. 2(a)) sandwiched between Sn-doped ($Nd \sim 5 \times 10^{17}$ $cm^{−3}$)(Region II of FIG. 2(a)) and Zn-doped ($Nd \sim 5 \times 10^{17}$ $cm^{−3}$)(Region IV of FIG. 2(a)) InAsSbP confining layers with a final layer of $p^+$doped InAs (1020 $cm^{−3}$) cap layer (Region V of FIG. 2(a)).

2. A second DH structure duplicates Example 1, but replaces the InAsSbP p-cladding layer with 1.2 µm-thick Be-doped ($7 \times 10^{17}$ $cm^{−3}$) $AlAs_{0.10}Sb_{0.84}$ (see FIG. 3(a)) using growth conditions.

Figures 3A, 3B:
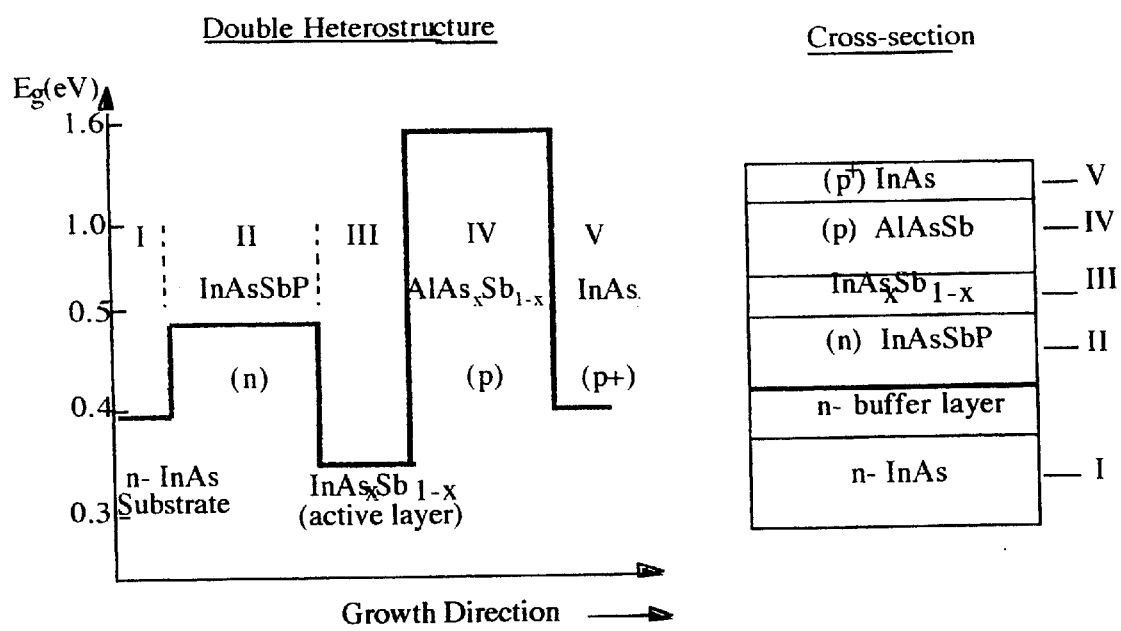
FIGS. 3(a) and (b) is a band diagram and structure of the double heterostructure InAs/InAsSb/AlAsSb with InAs as the cap layer.

3. AlAsSb/InAsSb/InAs lasers of the subjection invention can be fabricated, starting with an organic cleaning (tricholorethane, acetone, and methanol) of a substrate followed by a 10% hydrofluoric dip for several seconds. The structure of FIG. 3(b) is prepared by standard MOCVD procedures. 100 µm mesa is formed by using photolithography technology on the InAs cap layer. For the current to be confined along a 100 µm stripe contact, a wet chemical etch of $H_2SO_4:H_2O_2:H_2O$ (1:1:20) is used for a few seconds to etch approximately 0.1 μm of the p+-InAs cap layer. A schematic cross-section of a processing sequence for an 100 μm broad-area laser is shown in FIGS. 1(a–d).

Following the p-InAs cap layer etch, the processed wafers are covered with a Shipley photoresist film to avoid exposure of the AlAsSb p-cladding layer to air. The n-InAs substrate is mechanically lapped and polished to a thickness of ~120 μm. The reduction of the series resistance of the laser diode are greatly influenced by several parameters, including p-doping of the cap layer, thickness area of the diode, and the composition of the p- and n-methyl contact. The p- and n-metal contacts are formed by depositing 450 Å of titanium film (Ti), 500 Å of platinum (Pt), 1800 Å of Gold (Au) to the InAs cap layer; and 700–750 Å of Gold Germanium (AuGe), 300–400 Å of nickel (Ni), and 1800 Å of Gold (Au) to the n-InAs substrate. Minimum series resistance of 0.22 ohms can be obtained from these AlAsSb/InAsSb/InAs lasers by annealing the metal contact at temperatures between 300° C.–320° C. under nitrogen atmosphere for 3–4 minutes.

4. Using example 3 with AlAsSb as an alternative material for the upper cladding layer, a 1.5 μm-thick native oxide is grown on top of the exposed AlAsSb cladding layer (between the 100 μm metal stripes). Due to the mechanical strength of the native oxide and the high band gap energy of the AlAsSb (~1.6 eV), single diodes and laser array bars can be bonded p-side down onto an indium coated copper heatsink.

Using the technology described about, the AlAsSb/InAsSb/InAs lasers have resulted in batter performance in output power and better stability as compared to lasers with no passivation or passivation that is deposited by electron-beam evaporation. Naturally grown oxide for III–V semiconductor surface is a key issue to ensure current distribution along the stripe contact area of the laser; and the ability to bond single or laser array bars p-side down. AlAsSb/InAsSb/InAs lasers with 1.5 μm-thick of native oxide between the metal contact area can sustain high outpowers of 1.88 W per two facets under pulse operation and 325 mW per facets under continuous wave operation. Using copper heatsinks uncoated AlAsSb/InAsSb/InAs laser bars (5×100 μm-wide stripes) bonded p-side up or p-side down to the indium coated heatsink, one can obtain high output powers of 6.7 W per two facets in pulse operation and far-field divergence of 38° in the perpendicular direction.

Testing of a laser utilizing the semiconductor device of Example 3 showed high differential efficiency above 30% with High $T_0$ of 50 K and far-field beam divergence narrower than 40°.

Experimental results indicated that the junction temperature is significantly higher than the ambient temperature at such high current injection, about 50 K higher at 2 W output even in pulse mode, possibly due to high Joule heating. The higher band gap of the AlAsSb p-cladding layer significantly reduced the carrier leakage because of the much higher carrier confinement potential. As stated, the lasers have stripes of 100 μm-width separated 200 μm from each other (total optical aperture being 400~500 μm) with 1 mm cavity length, without coating or passivation on the mirror facets.

Currently lasers based on II–VI semiconductor compounds such as PbSn are commercially available for applications in this wavelength range, but the maximum optical power has been well below 1 mW to date. Thus those reported output powers are about 3~4 orders of magnitude improvement compared to such commercial lasers, and a least 2~3 times higher than the highest values previously reported in the literature from any kind of lasers at this wavelength range.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

What is claimed is:

1. A semiconductor structure comprising a double heterostructure having a lower cladding layer of InAsSbP, and an active layer of InAsSb, which is directly adjacent an upper cladding layer of AlAsSb.

2. The semiconductor structure of claim 1, wherein said upper cladding layer is $AlAs_{0.10}Sb_{0.84}$.

3. The semiconductor structure of claim 1, wherein said structure is bonded to a heat sink.

4. The semiconductor structure of claim 3, wherein said structure has a p-type cap layer, said cap layer being bonded to the heat sink.

5. A semiconductor laser diode comprising in sequence, a substrate, a buffer layer, an n-type cladding layer of InAsSbP, an active layer of $InAs_xSb_{1-x}$ ($0 \leq x \leq 1$), a p-type cladding of AlAsSb, and a cap layer of InAs.

* * * * *